US011934251B2

(12) United States Patent
Magro et al.

(10) Patent No.: US 11,934,251 B2
(45) Date of Patent: Mar. 19, 2024

(54) DATA FABRIC CLOCK SWITCHING

(71) Applicant: Advanced Micro Devices, Inc., Santa Clara, CA (US)

(72) Inventors: James R. Magro, Lakeway, TX (US); Christopher Weaver, Boxborough, MA (US); Abhishek Kumar Verma, Round Rock, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 234 days.

(21) Appl. No.: 17/219,407

(22) Filed: Mar. 31, 2021

(65) Prior Publication Data
US 2022/0317755 A1 Oct. 6, 2022

(51) Int. Cl.
*G06F 1/32* (2019.01)
*G06F 1/08* (2006.01)
*G06F 1/3225* (2019.01)
*G06F 1/3234* (2019.01)
(Continued)

(52) U.S. Cl.
CPC ............ *G06F 1/3275* (2013.01); *G06F 1/08* (2013.01); *G06F 1/3225* (2013.01); *G06F 1/3287* (2013.01); *G06F 3/0625* (2013.01); *G06F 3/0634* (2013.01); *G06F 3/0658* (2013.01); *G06F 3/0679* (2013.01)

(58) Field of Classification Search
CPC .... G06F 3/0625; G06F 3/0634; G06F 3/0658; G06F 3/0675; G11C 11/4072; G11C 11/4074
See application file for complete search history.

(56) References Cited

U.S. PATENT DOCUMENTS

2003/0079152 A1* 4/2003 Triece ................... G06F 1/3203
  713/322
2007/0288783 A1* 12/2007 Ogasawara ........... G06F 1/3225
  713/323
(Continued)

OTHER PUBLICATIONS

International Search Report and Written Opinion for International Application No. PCT/US2022/020694, dated Jun. 17, 2022, 8 pages.

*Primary Examiner* — Jaweed A Abbaszadeh
*Assistant Examiner* — Cheri L Harrington
(74) *Attorney, Agent, or Firm* — Polansky & Associates, P.L.L.C.; Paul J. Polansky; Nathan H. Calvert

(57) ABSTRACT

A memory controller couples to a data fabric clock domain, and to a physical layer interface circuit PHY clock domain. A first interface circuit adapts transfers between the data fabric clock domain (FCLK) and the memory controllers clock domain, and a second interface circuit couples the memory controller to the PHY clock domain. A power controller responds to a power state change request by sending commands to the second interface circuit to change parameters of a memory system and to update a set of timing parameters of the memory controller according to a selected power state of a plurality of power states. The power controller further responds to a request to synchronize with a new frequency on the FCLK domain by changing a set of timing parameters of the clock interface circuit without changing the set of timing parameters of the memory system or the selected power state.

22 Claims, 5 Drawing Sheets

(51) Int. Cl.
*G06F 1/3287* (2019.01)
*G06F 3/06* (2006.01)

(56) References Cited

U.S. PATENT DOCUMENTS

| | | | |
|---|---|---|---|
| 2008/0059823 A1* | 3/2008 | Balatsos | G06F 1/3203 |
| | | | 713/323 |
| 2009/0190429 A1* | 7/2009 | Brittain | G11C 8/18 |
| | | | 365/233.1 |
| 2009/0204831 A1* | 8/2009 | Cousson | G06F 1/3203 |
| | | | 713/322 |
| 2010/0257398 A1 | 10/2010 | Alexander et al. | |
| 2012/0173836 A1* | 7/2012 | Yermalayeu | G06F 13/1689 |
| | | | 711/E12.001 |
| 2012/0198266 A1* | 8/2012 | Hofmann | G06F 13/4022 |
| | | | 710/110 |
| 2013/0151569 A1* | 6/2013 | Therien | G06F 11/3672 |
| | | | 707/803 |
| 2014/0013138 A1* | 1/2014 | Kanai | G06F 1/3237 |
| | | | 713/323 |
| 2014/0281325 A1* | 9/2014 | Meaney | G06F 11/1675 |
| | | | 711/167 |
| 2016/0005484 A1 | 1/2016 | Lee et al. | |
| 2017/0004869 A1 | 1/2017 | Shin et al. | |
| 2017/0351450 A1* | 12/2017 | Brandl | G06F 3/0673 |
| 2017/0365305 A1* | 12/2017 | Chang | G06F 1/32 |
| 2018/0018105 A1* | 1/2018 | Magro | G11C 7/1072 |
| 2018/0074743 A1* | 3/2018 | Jeter | G06F 3/0634 |
| 2018/0226120 A1 | 8/2018 | Ellis et al. | |
| 2021/0263866 A1* | 8/2021 | Norman | G06F 13/1668 |
| 2022/0179473 A1* | 6/2022 | Ranel | G06F 1/206 |

\* cited by examiner

DATA FABRIC CLOCK SWITCHING

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC).

A memory controller is a digital circuit that manages the flows of data going to and from the DRAM over the memory bus. Known memory controllers receive memory access requests from the host system, store them in a queue, and dispatch them to the DRAM in an order selected by an arbiter. Memory controllers are typically directed to change their power states according to a group of defined power states in order to meet the memory usage demands of the computer system while conserving power where possible. Often, power states are controlled according to a specification such as the Advanced Configuration and Power Interface (ACPI) specification, which is a power management and configuration standard for computers such personal computers (PCs) and servers. ACPI allows the computer operating system to manage power consumed at various devices by changing the devices' operating modes from among a limited set of modes that may include different operating frequencies, different supply voltages, and different operating modes.

Figure 1:
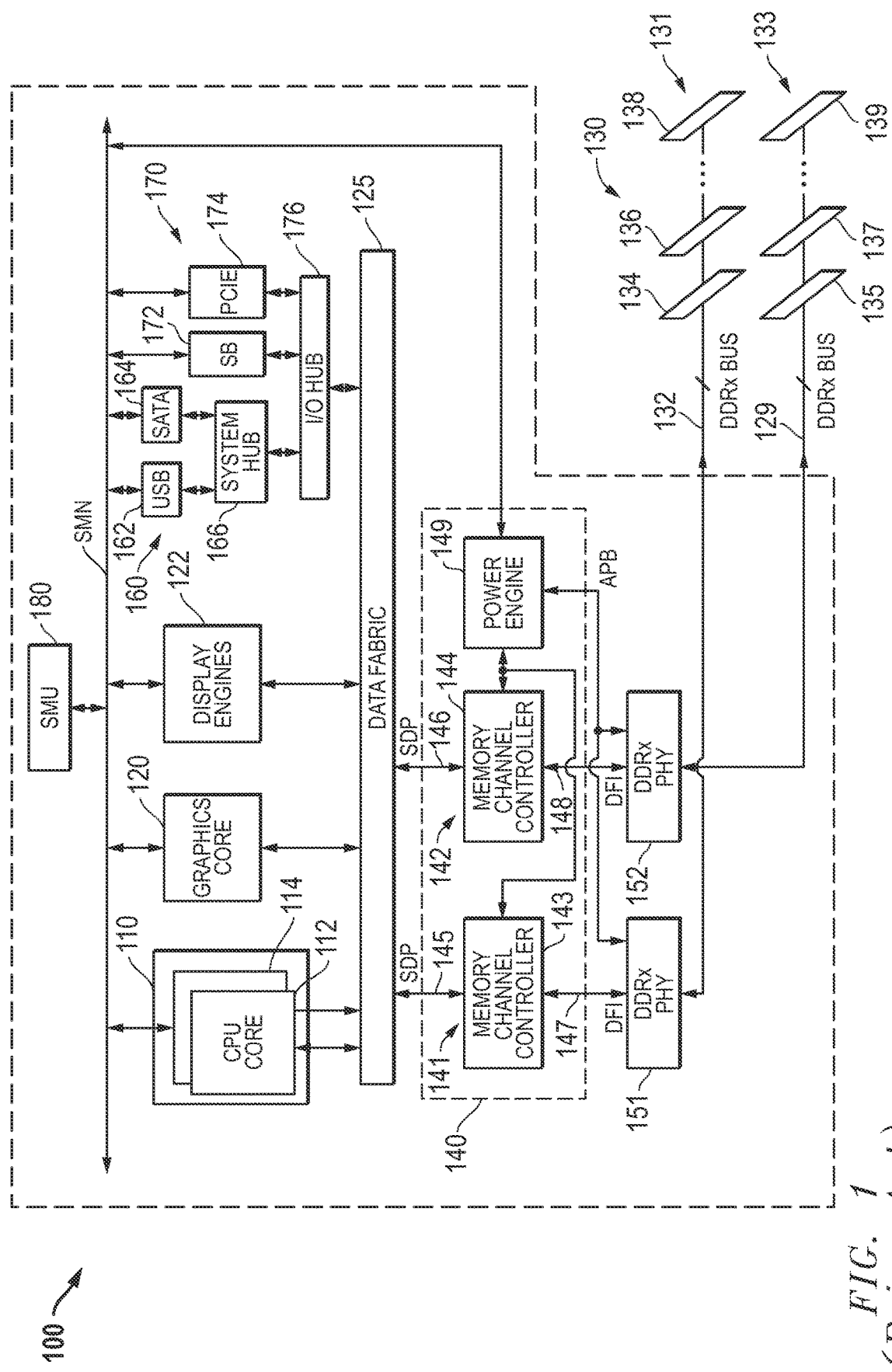
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a memory channel controller and a power controller. The memory channel controller has a first interface circuit adapted to connect to a data fabric operating in a first clock domain, and a second interface circuit adapted to connect to a physical layer interface circuit (PHY) operating in a third clock domain. The memory channel controller operates in a second clock domain according to a set of timing parameters. The first interface circuit includes a clock interface circuit for adapting transfers between the first clock domain and the second clock domain. The power controller is coupled to the memory channel controller and responsive to a power state change request to send commands to the second interface circuit to change parameters of a memory system, and to update the set of timing parameters of the memory channel controller according to a selected power state of a plurality of power states. The power controller is further responsive to a request to synchronize the first interface circuit with a new frequency of only a first clock signal of the first clock domain to change the set of timing parameters of the clock interface circuit without changing the set of timing parameters of the memory system or the selected power state.

A method includes receiving a power state command at a memory controller, and in response changing an operating frequency of at least one of a memory controller clock domain and a memory clock domain, resynchronizing a memory controller bus interface with a data fabric clock domain, and resynchronizing a PHY with the memory controller. The method includes receiving a request to resynchronize the memory controller with a frequency of only a first clock signal of the data fabric clock domain, and in response, changing a set of timing parameters of a clock interface circuit between the data fabric clock domain and the memory controller clock domain without resynchronizing the PHY with the memory controller, changing a set of timing parameters of the memory or the memory controller.

A data processing system includes a data fabric, a memory channel, a memory channel controller, and a power controller. The data fabric operates on a data fabric clock. The memory channel includes a PHY operating on a memory clock domain for coupling to a DRAM memory. The memory channel controller also includes a first interface circuit adapted to connect to the data fabric, and a second interface circuit adapted to connect to the PHY. The memory channel controller operates in a second clock domain according to a set of timing parameters. The first interface circuit includes a clock interface circuit for adapting transfers between the first clock domain and the second clock domain. The power controller is connected to the memory channel controller and responsive to a power state change request to send commands to the second interface circuit to change parameters of a memory system and to update the set of timing parameters of the memory channel controller according to a selected power state of a plurality of power states. The power controller is further responsive to a request to synchronize the interface circuit with a new frequency of only a first clock signal of the data fabric clock domain (FCLK) to change the set of timing parameters of the clock interface circuit without changing the set of timing parameters of the memory system or the selected power state.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a data fabric 125, a memory management hub 140, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 through data fabric 125 for uniform translation into appropriate addresses in memory system 130.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over advanced peripheral bus (APB) interface 254, and is also bidirectionally connected to memory channel controllers 143 and 144. PHY 151 has a bidirectional connection to memory channel 131. PHY 152 has a bidirectional connection to memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version five (DDR5), DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
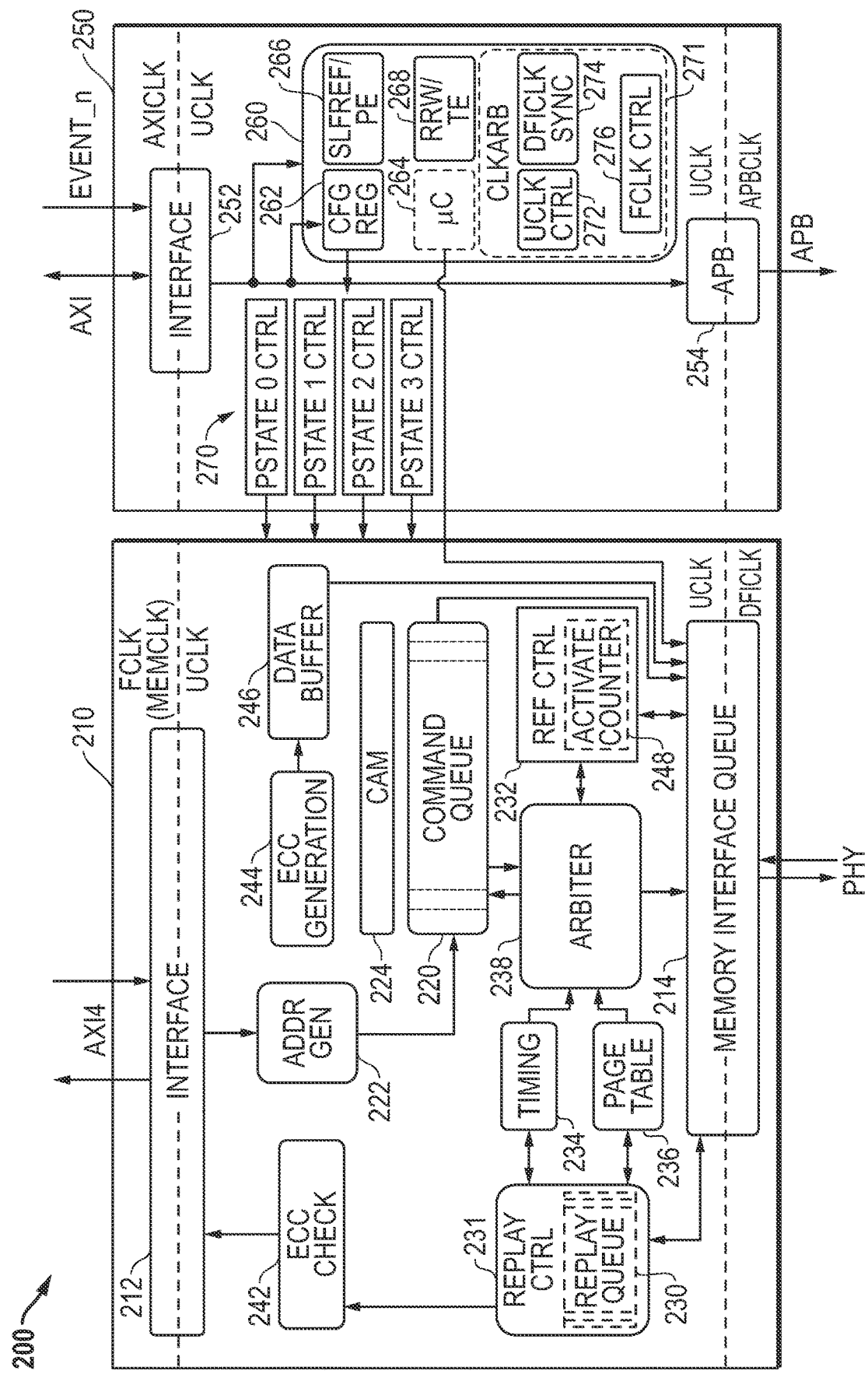
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh control logic block 232, a timing block 234, a page table 236, an arbiter 238, an error correction code (ECC) check circuit 242, an ECC generation block 244, a data buffer 246, and refresh control logic 232.

Interface 212 has a first bidirectional connection to data fabric over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the "FCLK" domain to a second clock domain internal to memory controller 200 known as the "UCLK" domain. Similarly, memory interface queue 214 provides memory accesses from the UCLK domain to a "DFICLK" domain associated with the DFI interface.

Address generator 222 decodes addresses of memory access requests received from the data fabric over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. This ECC data is then added to the write data in data buffer 246. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh control logic 232 generates refresh commands periodically and in response to designated conditions to prevent data errors caused by leaking of charge off storage capacitors of memory cells in DRAM chips. Refresh control logic 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210, performing intelligent scheduling of accesses to improve the usage of the memory bus. In this embodiment, arbiter 238 includes a bank group tracking circuit 235 for tracking the bank group numbers of a number of recently issued write commands, and "masking" those bank groups by preventing dispatch of commands to them for a designated period of time under certain conditions, as further described below. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Power controller 250 generally includes an interface 252 to an advanced extensible interface, version one (AXI), an advanced peripheral bus (APB) interface 254, a power engine 260, and a set of power state control logic blocks 270. Interface 252 has a first bidirectional connection to the SMN, and an output. APB interface 254 has an input connected to the output of interface 252, and an output for connection to a PHY over the APB.

Power engine 260 has an input connected to the output of interface 252, an output connected to an input of memory interface queue 214. Power engine 260 includes a set of configuration registers 262, a microcontroller (µC) 264, a self refresh controller (SLFREF/PE) 266, a reliable read/write timing engine (RRW/TE) 268, and memory controller clock domain state change circuitry ("CLKARB") 271 including a UCLK control logic block 272, a DFICLK synchronization logic block 274, and a FCLK synchronization logic block 276. Configuration registers 262 are programmed over the AXI bus, and store configuration information to control the operation of various blocks in memory controller 200 in a selected one of four different power states through power state control logic blocks 270. Accordingly, power state control logic blocks 270 have outputs connected to the various blocks in memory controller 200 that are not shown in detail in FIG. 2. SLFREF/PE 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

In operation, power controller 250 receives power state commands from SMU 180 (FIG. 1) through a power management control interface of the Data Fabric, and in response changes the power state of memory controller 200 and the attached DRAM(s) to enter a new power state, which typically includes a different clock speed for the DFICLK domain and the UCLK domain. Each of power state control logic blocks 270 implements a respective one of the power states by controlling the various blocks of memory controller 200 to operate according to the respective power state according to configuration values set in configuration registers 262. The configuration values include a set of timing parameters and other configuration parameters for configuring the memory channel controller to operate at each power state.

When power states of memory controller 200 are changed, UCLK control logic block 272 sends the necessary signals to control and coordinate the various blocks of memory channel controller 210 in changing to the new power state as specified in a power state command from SMU 180. UCLK control logic block 272 includes circuitry which pauses operation of various logic blocks in memory channel controller 210, coordinates changing the UCLK frequency when needed, and coordinates changing the memory channel controller 210 to operate on new configuration register values through a respective power state control logic block 270.

DFICLK synchronization logic block 274 is used each time there is a change in either the UCLK or the DFICLK. It contains circuitry for controlling the synchronization between these two clock domains in memory interface queue 214, which typically includes pausing the interface, applying the new clock frequencies, and commanding the interface to synchronize across the new clock frequencies. In some embodiments, contents of memory interface queue 214 or various queues within it are temporarily saved to local RAM to complete the synchronization. DFICLK synchronization logic block 274 is activated by µC 264 for each power state change, except those provided herein which only concern an FCLK change, as further described below.

FCLK synchronization logic block 276 is used each time there is a change in the UCLK or FCLK frequency. FCLK synchronization logic block 276 contains circuitry for controlling the synchronization between these two clock domains in interface 212. The synchronization process typically includes pausing interface 212, allowing SMU 180 to adjust the frequency of FCLK in the FCLK clock domain of data fabric 125, commanding interface 212 to synchronize across the new clock frequencies, and then reestablishing a connection to the data fabric.

Figure 3:
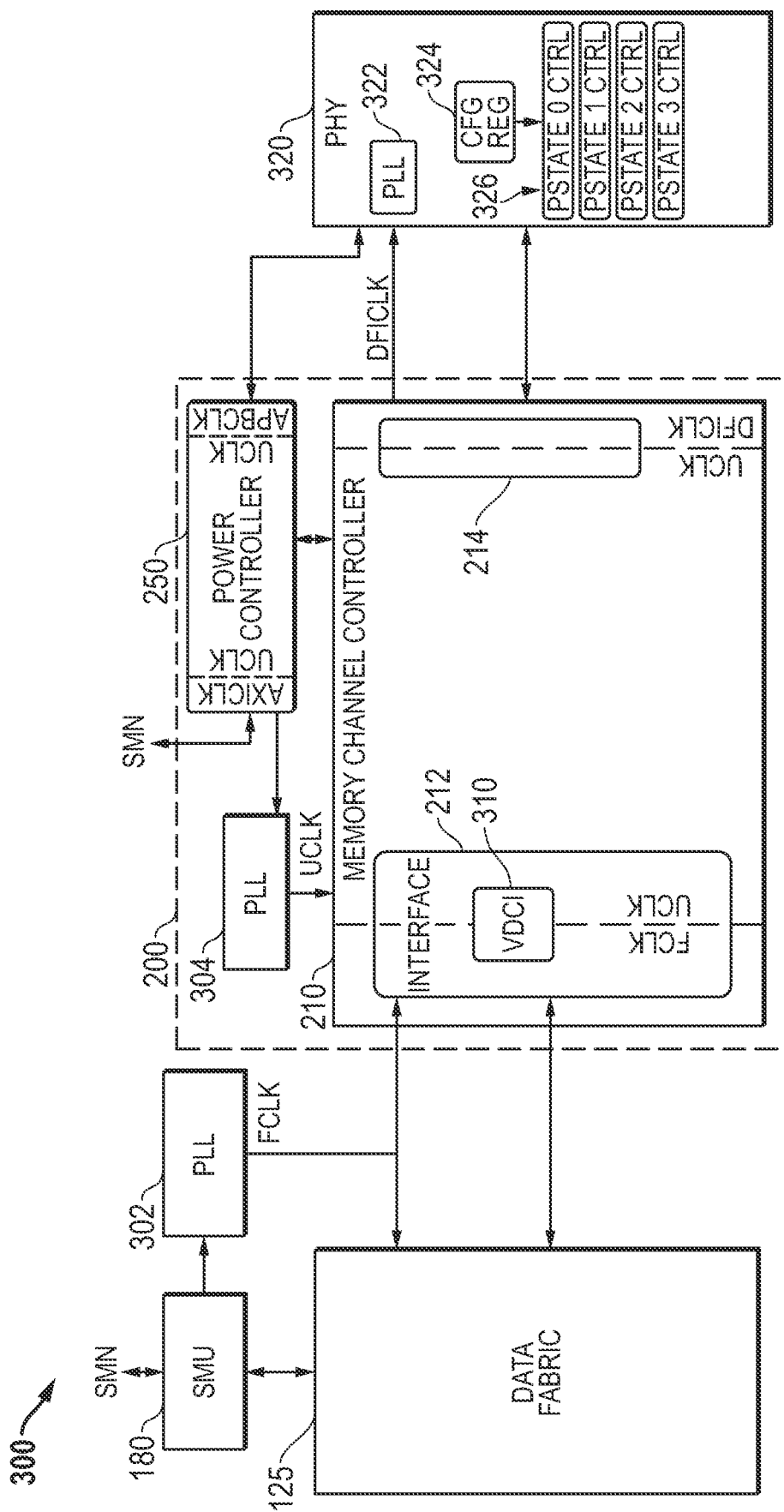
FIG. 3 illustrates in block diagram form certain elements of an APU for providing clock domain signals and synchronization across clock domains at memory channel controller.

FIG. 3 illustrates in block diagram form certain elements of an APU 300 for providing clock domain signals and synchronization across clock domains at memory channel controller 210. APU 300 in this embodiment includes a memory controller 200 like that of FIG. 2, but only relevant elements are depicted. APU 300 includes data fabric 125, SMU 180, memory controller 200, an FCLK PLL 302, a UCLK PLL 304, and a PHY 320.

SMU 180 has an output connected to FCLK PLL 302, a bidirectional connection to data fabric 125, and a bidirectional connection to the SMN. SMU 180 generally implements power state control decisions from the operating system kernel, and, in some embodiments, makes additional decisions as to what power state various portions of APU 300 should be in based on a variety of conditions throughout APU 300. SMU exposes power state control to the APU 300 operating system as defined in a system power state specification such as the Advanced Configuration and Power Interface (ACPI), which is a power management and configuration specification for computers such personal computers (PCs) and servers. ACPI allows the computer operating system to manage power consumed at various devices by changing the devices operating mode from among a limited set of power states that may include different operating frequencies, different supply voltages, and other differences. In particular, SMU 180 selects power states for data fabric 125, memory controller 200, and PHY 320 along with its associated DRAM memory. Other power state adjustments can also be made by other system elements.

Data fabric 125 is a scalable data fabric connecting the system processing cores to various subsystems, as described with respect to FIG. 1, and has a bidirectional connection to SMU 180, a bidirectional connection to memory controller 200, and an input connected to the output of FCLK PLL 302. Data fabric 125 operates in the FCLK clock domain, based on the FCLK signal provided by FCLK PLL 302.

Memory controller 200 includes memory channel controller 210 and power controller 250, as described with respect to FIG. 2. Power controller 250 is connected to memory channel controller for controlling various portions thereof, has an output connected to UCLK PLL 304, bidirectional connection to the SMN over an AXI interface, and a bidirectional connection to PHY 320. Memory channel controller includes interface 212 for connecting to data fabric 125, and memory interface queue 214 for connecting to PHY 320, and an input receiving the UCLK signal from UCLK PLL 304. As describe with respect to FIG. 2, memory channel controller 210 runs in the UCLK clock domain, and interfaces to the FCLK domain through interface 212, and to the DFICLK domain of PHY 320 through memory interface queue 214 and its associated PHY interface. Depicted in FIG. 3 is a voltage domain crossing interface (VDCI) 310 inside interface 212 of memory channel controller 210, which connects between the FCLK and UCLK clock domains.

PHY 320 has a bidirectional connection to power controller 250, a bidirectional connection to memory channel controller 210, and an input connected to memory channel controller 210 for receiving the DFICLK clock signal, which typically has a frequency of FCLK/2. DFICLK and UCLK are equal when UCLK is also set to FCLK/2, and DFICLK is at half the frequency of UCLK when UCLK is set equal to FCLK. PHY 320 includes a memory clock PLL 322 for generating the clock signal with which to conduct signaling on the memory bus. PLL 322 uses DFICLK as a reference. PHY 320 includes a group of configuration registers 324 for holding the many configuration values needed to interface with DDRx memory in its various supported modes and power states. PHY 320 also includes a set of four power state control logic blocks 326, each connected to respective sets of configuration registers 324, for controlling the PHY circuitry to implement four supported power states. While more than four power states are supported in some embodiments, the four power states defined by the ACPI interface are typically used. Adding more power states typically requires adding more configuration registers with associated power state control logic to implement the additional power states. The configuration values include timing parameters and other configuration parameters for configuring the PHY to operate at each power state. Configuration registers 324 are configurable over the SMN through power controller 250.

APU 300 allows the data fabric, running on the FCLK domain, to run at different frequencies than the typical 1:1 or 1:2 relationships to the memory controller clock domain and the DFICLK clock domain. VDCI 310 provides an asynchronous clock interface circuit including asynchronous first-in-first-out (FIFO) buffers allowing the data fabric to operate at frequencies less than UCLK (for example, to save power in signaling during low traffic operation), greater than UCLK (for example, if the data fabric has a high traffic load between other system components. To support settings where FCLK is less than UCLK, memory controller 200 will throttle read responses and buffer transfers to the data fabric to prevent overflowing the slower FCLK interface.

Figure 4:
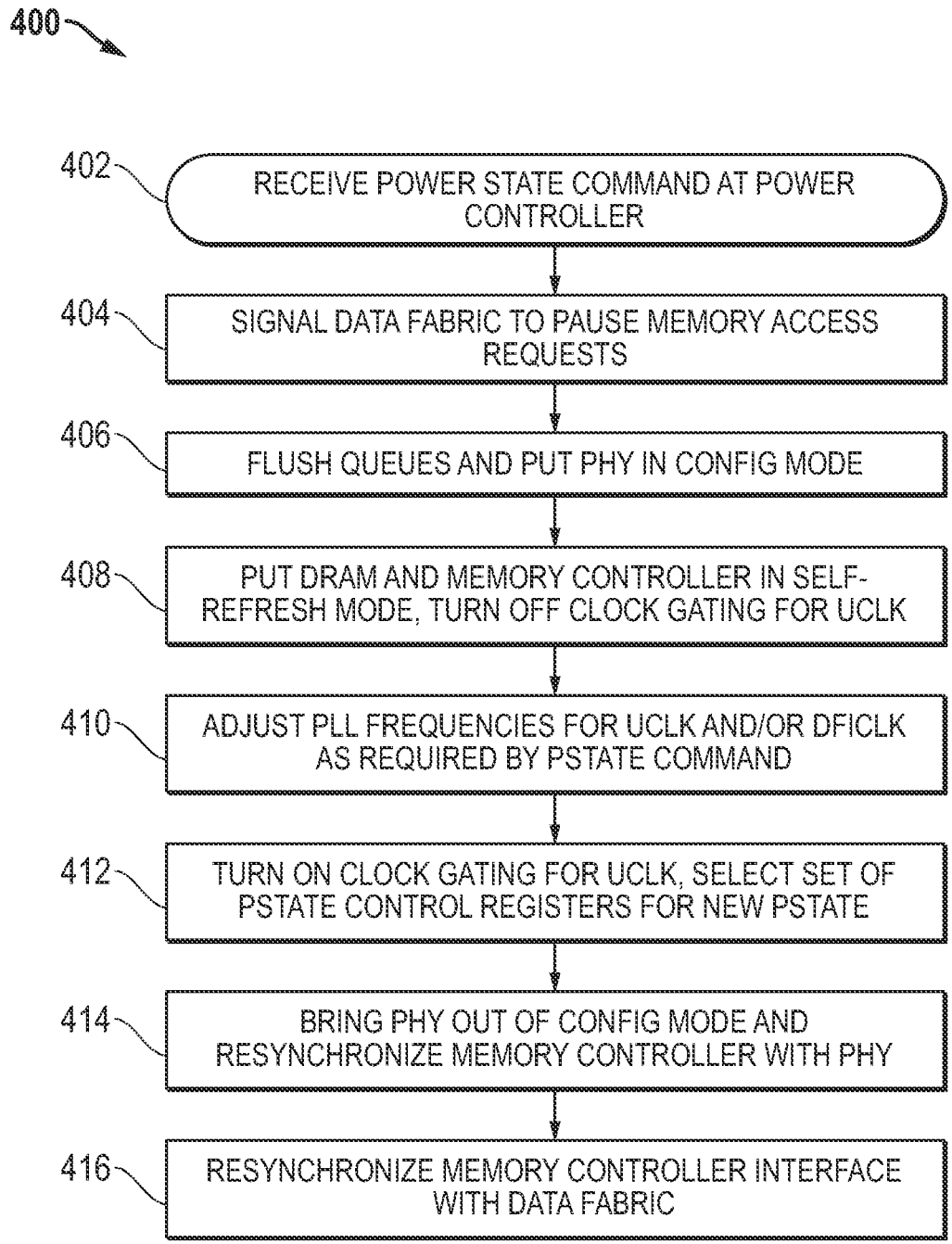
FIG. 4 shows a flowchart of a process for altering a power state at a memory controller according to some embodiments.

Memory controller 200 supports changes of the FCLK domain frequency in an efficient manner which does not require resynchronizing the UCLK to the interface of memory interface queue 214, or resetting the PHY and flushing queues related to the PHY, as is typically done when changing power states, for example, according to the process of FIG. 4.

In operation, power controller 250 responds to a power state change request by updating the set of timing parameters of the memory channel controller, and sending commands to the DFI interface circuit of memory interface queue 214 to change parameters of the memory system to a selected memory power state of from among the supported power states, and activating circuitry to accomplish the adjustments in memory controller 200. An example of this process is described with respect to FIG. 4. Power controller 250 is further responsive to a request to synchronize the memory controller with a new frequency of only the FCLK signal of the FCLK clock domain, known herein as an F-clock only power state change, by changing the set of timing parameters of VDCI 310, and resynchronizing the VDCI across the FCLK and UCLK domains without changing the set of timing parameters or the selected power state in which memory channel controller 210 and PHY 320 are operating. An example of this process is described with respect to FIG. 5.

FIG. 4 shows a flowchart 400 of a process for altering a power state at a memory controller according to some embodiments. The process is suitable for use with the memory controller of FIG. 2 and FIG. 3, and other memory controllers including data fabric synchronization circuitry and PHY synchronization circuitry for altering adjusting power states. This process is an example of a complete power state transition including resynchronizing both interfaces of the memory controller. The power state command is typically a command to change to another an ACPI exposed power state defined for the memory system, and may include changes to any combination of UCLK, DFICLK, and FCLK. This process is described to provide an example of the complexity and latency of performing power state transitions.

The process starts at block 402 where a power state command is received at power controller 250. Typically, the power state command is received from a system management controller such as SMU 180. At block 404, power controller 250 signals the data fabric to pause memory access requests to memory controller 200. This signal typically goes to a coherent slave controller on the data fabric, but in other embodiments the signal can go to another system element, such as SMU 180, which commands the data fabric to halt memory access requests to memory controller 200.

At block 406, power controller commands the memory controller to flush its various queues and puts the PHY in a configuration mode. This flush step is optional because the PHY is not powered down. At block 408, power controller 250 puts memory controller 200 and its associated DRAM into self-refresh mode, and turns off the clock gating of the UCLK signal into memory controller 200. In the embodiment of FIG. 2, blocks 406 and 408 are performed using UCLK control logic block 272. In other embodiments, other suitable memory clock domain control circuitry is used.

At block 410, power controller 250 adjusts the frequencies for the UCLK and/or DFICLK PLLs to the required frequencies specified by the power state command, typically by writing to designated control registers. This block includes a period of time for the PLL frequencies to ramp up or down to their new operating frequency. Then at block 412 the power controller turns on the clock gating of the UCLK signal into memory controller 200, and selects a set of power state control registers in configuration registers 262 for controlling operation in the new power state. This block includes time for the logic blocks within memory controller 200 to initialize.

At block 414, power controller 250 brings the PHY out of configuration mode and resynchronizes memory controller 200 with the PHY. In the embodiment of FIG. 2, block 414 is accomplished using DFICLK synchronization logic block 274 to resynchronize the DFI interface of memory interface queue 214 with the PHY. In other embodiments, other suitable memory clock domain state change circuitry is used.

At block 416, power controller 250 resynchronizes the memory controller interface with the data fabric at the new frequency relationship between FCLK and UCLK. In the embodiment of FIG. 2, block 416 is accomplished using FCLK synchronization logic block 274, while in other embodiments other clock synchronization circuitry is used.

As can be understood, the power state change process generally causes operational delay, on the order of many microseconds, and also requires the contents of various queues to be unloaded or flushed, and reloaded after the power state change. Thus, a memory power state change requests can cause very long latency to any new memory access requests that are generated during the power state change.

Figure 5:
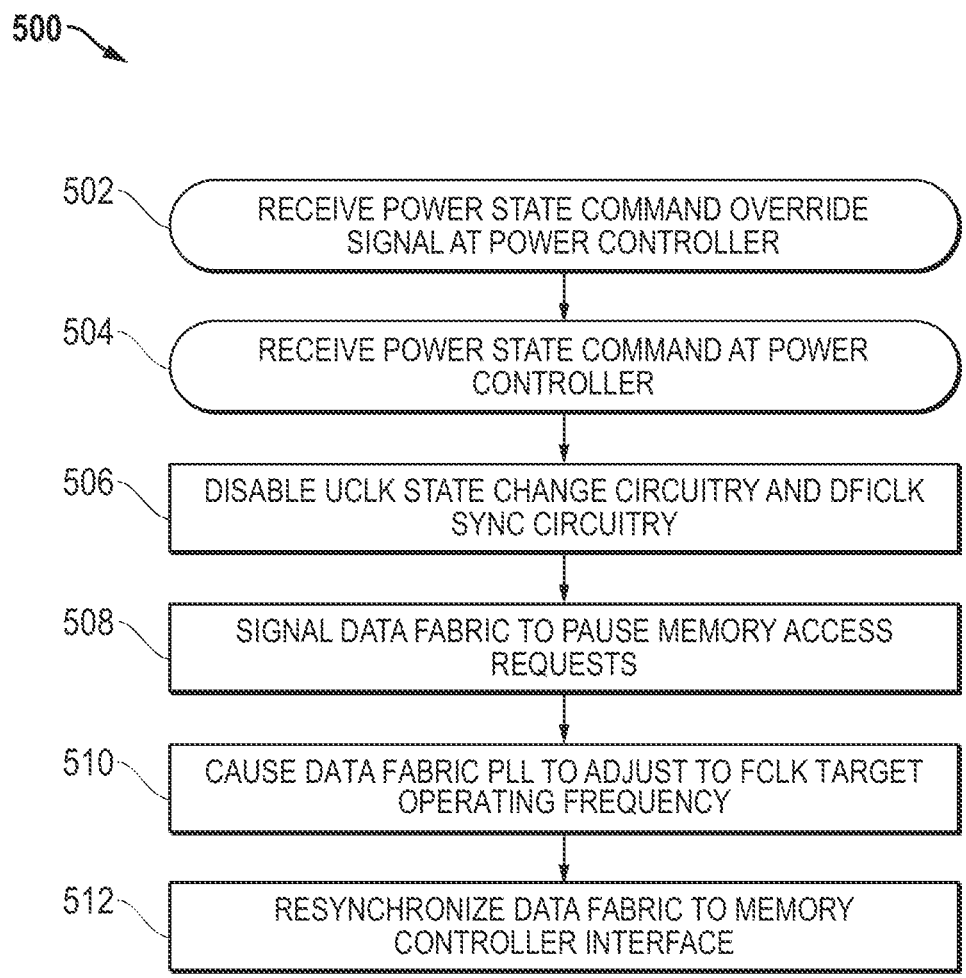
FIG. 5 shows a flowchart of a process for responding to a power state command according to some embodiments.

FIG. 5 shows a flowchart 500 of a process for responding to a power state command according to some embodiments. The depicted process allows for adjusting the frequency of the data fabric in combination with a power state command implemented at the memory controller to resynchronize the memory controller to the data fabric. The process has the advantage of supporting certain adjustments in the memory controller power state without the disruption of the memory controller operation exhibited by the process of FIG. 4. The process also has the advantage of supporting more variability in adjusting the data fabric clock than that provided by the ACPI power state commands.

The process starts at block 502, in which a power state command override signal is received at power controller 250. The power state override command indicates to the power controller that the subsequent or accompanying power state command will not change the UCLK clock frequency or the DFICLK clock frequency. In the illustrated embodiment, the power state override command is sent from SMU 180 to power controller 250. The decision to send a power state override command and an FCLK-only power state command is made by the operating system kernel in some embodiments, and implemented by command to SMU 180. In some other embodiments, SMU 180 may not expose this capability to the operating system, and instead make the decision itself. Further embodiments may allow either SMU 180 or the operating system kernel control this feature. The decision is made generally to improve power efficiency of the data fabric while still allowing it to handle its workload demand, while minimizing impact on the memory channel throughput and latency. Employing a power state command to accomplish such changes has the advantage of utilizing the existing framework of ACPI power states, while providing an expanded capability within that framework.

At block 504, power controller 504 receives an FCLK-only power state command which is subsequent to or accompanies the power state command override signal received at block 502. In some embodiments, the command override signal may be included in the power state command, while in others the command override signal is separate and indicates that the single subsequent power state command will be subject to override conditions.

At block 506, the process implements the override by disabling or deactivating memory controller clock domain state change circuitry, which in this embodiment is UCLK control logic block 272, and memory clock domain state change circuitry, which in this embodiment is DFICLK synchronization logic block 274. The circuitry is disabled to prevent the state change circuitry from changing the memory controller clock domain (UCLK) and memory clock domain (DFICLK), and to prevent resynchronizing the memory controller interface to the PHY. This avoids performing blocks 406, 408, 410, 412, and 414 of FIG. 4 when responding to a power state command which only concerns a data fabric clock frequency change. The circuitry for performing those blocks is disabled or deactivated preferably by setting a control bit or activating a control gate responsive to the power state override command. This setting may be performed immediately after receiving the power state override signal at block 502, such that the relevant circuitry is disabled when the power state command is received at block 504. In this manner, the same circuitry employed for changing between the limited number of power states supported by ACPI is employed to support expanded capabilities in switching the data fabric clock domain clock frequency. This scheme has the advantage of supporting more values for the data fabric clock domain frequency than are made available in the limited number of power states supported by control registers in the memory controller and PHY.

At block 508, power controller 250 signals the data fabric to pause memory access requests. As discussed with respect to FIG. 4, in other embodiments this is accomplished by signaling the SMU to request that it halt memory access requests to the memory controller over the data fabric.

At block 510, SMU 180 causes the data fabric clock (FCLK) frequency to adjust to a new desired operating frequency by adjusting FCLK PLL 302 (FIG. 3). The new operating frequency is preferably specified in the power state command at block 504 such that it is available to power controller 250. While SMU 180 controls FCLK PLL 302 in this embodiment, other embodiments can employ other control schemes for adjusting the data fabric clock frequency. The new data fabric clock frequency can be selected from frequencies specified in one of the limited number of power states provided in power state control logic blocks 270 (FIG. 2), and can be selected from frequencies not specified in those power states. The new data fabric clock frequency can be higher or lower than the memory controller clock domain (UCLK) frequency.

When the data fabric clock frequency has ramped or transitioned to the new value and stabilized, the memory controller at block 512 resynchronizes its interface to the data fabric. In this embodiment, power controller 250 controls the resynchronization by activating FCLK synchronization logic block 276. This controls VDCI 310 (FIG. 3) in interface 212 causing it to resynchronize with the data fabric over its asynchronous FIFO architecture. At this point, the power state change has been accomplished and the power controller can signal for the data fabric to resume sending memory access requests to memory controller 200.

As can be understood, the use of an F-clock only power state command allows the power state command framework to be employed for an additional capability of FCLK changes, with modifications that improve the speed of a power state changeover at the memory controller. Another advantage is that FCLK alterations beyond those specified within defined power states can be made in a system that supports only a limited number of power states, such as four which is a typical number supported at the time of filing. The data fabric may be run at a slower clock frequency than that specified in the defined set of power states, or a faster clock frequency. This allows efficiency adjustments to the data fabric to handle workload demand that may be unrelated to the specific memory controller or controllers which are subject to the F-clock only power state command. In embodiments for which the F-clock only power state command is not exposed to the operating system, the process of FIG. 5 is preferably transparent to the operating system such that the operating system kernel power state control process can treat the current power state as it would without the FCLK alteration, while the operating system can use the data fabric at the new operating frequency of the data fabric clock domain.

Memory controller 200 of FIG. 2 or any portions thereof, such as power controller 250 and FCLK synchronization logic block 274, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMMIs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller, comprising:
    a memory channel controller having a first interface circuit adapted to couple to data fabric operating in a first clock domain, and a second interface circuit adapted to couple to a physical layer interface circuit (PHY) operating in a third clock domain, wherein the memory channel controller operates in a second clock domain according to a set of timing parameters, wherein the first interface circuit includes a clock interface circuit for adapting transfers between the first clock domain and the second clock domain; and
    a power controller coupled to the memory channel controller and responsive to a power state change request to send commands to the second interface circuit to change parameters of a memory system, the memory system comprising a memory channel and a memory, and to update the set of timing parameters of the memory channel controller according to a selected power state of a plurality of power states,
    wherein the power controller is further responsive to a request to synchronize the first interface circuit with a new frequency of only a first clock signal of the first clock domain to change the set of timing parameters of the clock interface circuit without changing the set of timing parameters of the memory system or the selected power state.

2. The memory controller of claim 1, wherein the request to synchronize with a new frequency of only a first clock signal of the first clock domain includes a power state override signal and a subsequent power state command, the power state override signal causing the power controller to disable selected memory controller clock domain state change circuitry and memory clock domain state change circuitry when responding to a subsequent power state command associated with a change of the first clock domain.

3. The memory controller of claim 2, wherein the power controller is further operable to:
    when responding to a power state command without a prior power state command override signal, select a new set of power state control registers from among a number of sets of power state registers on the memory controller containing operating parameters for the memory controller; and
    when responding to a power state command with a prior power state command override signal, not select a new set of power state control registers.

4. The memory controller of claim 2, wherein the power controller is further operable to:
    when responding to a power state command without a prior power state command override signal, selecting a new set of power state control registers on the PHY from among a number of sets of power state control registers on the PHY containing operating parameters for the PHY; and
    when responding to a power state command with a prior power state command override signal, not selecting a new set of power state control registers on the PHY.

5. The memory controller of claim 4, wherein the sets of power state control registers on the PHY each correspond to a supported power state of a dynamic random access memory (DRAM) connected to the PHY and associated with the memory controller.

6. The memory controller of claim 1, further comprising a phase-locked loop (PLL) supplying a clock signal for the second clock domain and coupled to the power controller.

7. A method, comprising:
    receiving a power state command at a memory controller, and in response changing an operating frequency of at least one of a memory controller clock domain and a memory clock domain, resynchronizing a memory controller bus interface with a data fabric clock domain, and resynchronizing a physical layer interface (PHY) with the memory controller; and
    receiving a request to resynchronize the memory controller with a frequency of only a first clock signal of the data fabric clock domain, and in response, changing a set of timing parameters of a clock interface circuit between the data fabric clock domain and the memory controller clock domain without resynchronizing the PHY with the memory controller, changing a set of timing parameters of a memory or the memory controller besides the timing parameters of the clock interface circuit.

8. The method of claim 7, wherein the request to resynchronize the memory controller includes a power state override signal and a subsequent power state command, the method further comprising disabling selected memory controller clock domain state change circuitry and memory clock domain state change circuitry when responding to a subsequent power state command associated with a change of the data fabric clock domain.

9. The method of claim 7, further comprising:
    when responding to a power state command without a prior power state command override signal, selecting a new set of power state control registers from among a number of sets of power state control registers on the memory controller containing operating parameters for the memory controller; and when responding to a power state command with a prior power state command override signal, not selecting a new set of power state control registers.

10. The method of claim 7, further comprising:

when responding to a power state command without a prior power state command override signal, selecting a new set of power state control registers on the PHY from among a number of sets of power state control registers on the PHY containing operating parameters for the PHY; and when responding to a power state command with a prior power state command override signal, not selecting a new set of power state control registers on the PHY.

11. The method of claim 10, wherein the sets of power state control registers on the PHY each correspond to a supported power state of a dynamic random access memory (DRAM) connected to the PHY and associated with the memory controller.

12. The method of claim 7, further comprising, in response to a power state command without a prior power state command override signal, adjusting a phase-locked loop (PLL) supplying a clock signal for the memory controller clock domain.

13. The method of claim 7, further comprising, at a system management unit controller, determining that the data fabric clock domain should change its operating frequency, then transmitting the power state command override signal to the memory controller, causing the data fabric clock domain to change its operating frequency, and transmitting a subsequent power state command to the memory controller.

14. The method of claim 13, wherein the subsequent power state command includes power state data indicating a current memory controller clock domain operating frequency, a current memory clock domain operating frequency, and an adjusted data fabric clock domain operating frequency.

15. A data processing system, comprising:

a data fabric operating on a data fabric clock domain;

a memory channel including a physical layer interface (PHY) operating on a memory clock domain for coupling to a DRAM memory;

a memory channel controller including a first interface circuit adapted to couple to the data fabric, and a second interface circuit adapted to couple to the PHY, wherein the memory channel controller operates in a memory channel clock domain according to a set of timing parameters, wherein the first interface circuit includes a clock interface circuit for adapting transfers between the data fabric clock domain and the memory channel clock domain; and a power controller coupled to the memory channel controller and responsive to a power state change request to send commands to the second interface circuit to change parameters of a memory system, the memory system comprising the memory channel and the DRAM memory, and to update the set of timing parameters of the memory channel controller according to a selected power state of a plurality of power states, wherein the power controller is further responsive to a request to synchronize the clock interface circuit with a new frequency of only a first clock signal of the data fabric clock domain to change the set of timing parameters of the clock interface circuit without changing the set of timing parameters of the memory system or the selected power state.

16. The data processing system of claim 15, wherein the request to synchronize the clock interface circuit with a new frequency of only a first clock signal of the data fabric clock domain includes a power state override signal and a subsequent power state command, the power state override signal causing the power controller to disable selected memory controller clock domain state change circuitry and memory clock domain state change circuitry when responding to a subsequent power state command associated with a change of the data fabric clock domain.

17. The data processing system of claim 16, wherein the power controller is further operable to:

when responding to a power state command without a prior power state command override signal, select a new set of power state control registers from among a limited number of sets of power state registers on the memory channel controller containing operating parameters for the memory channel controller; and when responding to a power state command with a prior power state command override signal, not select a new set of power state control registers.

18. The data processing system of claim 16, wherein the power controller is further operable to:

when responding to a power state command without a prior power state command override signal, selecting a new set of power state control registers on the PHY from among sets of power state control registers on the PHY containing operating parameters for the PHY; and when responding to a power state command with a prior power state command override signal, not selecting a new set of power state control registers on the PHY.

19. The data processing system of claim 18, wherein the sets of power state control registers on the PHY each correspond to a supported power state of a dynamic random access memory (DRAM) connected to the PHY and associated with the memory channel controller.

20. The data processing system of claim 15, further comprising a phase-locked loop (PLL) supplying a clock signal for the memory channel clock domain and coupled to the power controller.

21. The data processing system of claim 16, further comprising a system management unit coupled to the data fabric and operable to send the power state commands and the power state command override signal to the memory channel controller.

22. The data processing system of claim 21, wherein the system management unit is further operable to control an operating frequency of the data fabric clock domain.

* * * * *